(12) United States Patent
Feng et al.

(10) Patent No.: US 12,111,343 B2
(45) Date of Patent: Oct. 8, 2024

(54) COAXIAL PROBE

(71) Applicant: XCERRA CORPORATION, Norwood, MA (US)

(72) Inventors: Yukang Feng, St. Paul, MN (US); Jason Mroczkowski, St. Paul, MN (US); Marty Cavegn, St. Paul, MN (US)

(73) Assignee: Xcerra Corporation, Norwood, MA (US)

( * ) Notice: Subject to any disclaimer, the term of this patent is extended or adjusted under 35 U.S.C. 154(b) by 796 days.

(21) Appl. No.: 16/989,406

(22) Filed: Aug. 10, 2020

(65) Prior Publication Data

US 2022/0043029 A1 Feb. 10, 2022

(51) Int. Cl.
*G01R 3/00* (2006.01)
*G01R 1/067* (2006.01)
*G01R 1/073* (2006.01)
*G01R 31/28* (2006.01)
*H01L 21/66* (2006.01)

(52) U.S. Cl.
CPC ........... *G01R 3/00* (2013.01); *G01R 1/06772* (2013.01); *G01R 1/07307* (2013.01); *G01R 1/07342* (2013.01); *G01R 31/2889* (2013.01); *H01L 22/14* (2013.01); *H01L 2924/00* (2013.01); *H01L 2924/00014* (2013.01); *H01L 2924/3011* (2013.01)

(58) Field of Classification Search
CPC .. G01R 3/00; G01R 1/07307; G01R 31/2889; G01R 1/06772; G01R 1/07314; G01R 1/06722; G01R 1/07342; H01L 22/14; H01L 2924/00; H01L 2924/3011; H01L 2924/00014
USPC ......... 324/71, 378, 403, 415, 425, 500, 537, 324/755.01, 755.02
See application file for complete search history.

(56) References Cited

U.S. PATENT DOCUMENTS

| | | | | |
|---|---|---|---|---|
| 2008/0044623 | A1* | 2/2008 | Caldwell | G01R 3/00 428/137 |
| 2010/0244270 | A1* | 9/2010 | Asami | H01L 27/1469 257/773 |
| 2014/0015561 | A1* | 1/2014 | Chang | G01R 1/07342 324/756.03 |
| 2016/0299174 | A1* | 10/2016 | Pan | G01R 1/07378 |
| 2019/0204357 | A1* | 7/2019 | Tong | H05K 1/111 |
| 2019/0250190 | A1* | 8/2019 | Shi | H05K 1/111 |
| 2020/0083582 | A1* | 3/2020 | Mroczkowski | H01L 23/66 |
| 2021/0223288 | A1* | 7/2021 | Weikle | G01R 19/0046 |
| 2022/0317155 | A1* | 10/2022 | Hironaka | G01R 1/06722 |

* cited by examiner

*Primary Examiner* — Raul J Rios Russo
(74) *Attorney, Agent, or Firm* — Knobbe, Martens, Olson & Bear, LLP (57) ABSTRACT

An apparatus and method for the manufacturing and use in a semiconductor test system is disclosed. The apparatus includes a signal probe and a dielectric sleeve surrounding the signal probe. A method includes forming a mold to receive a component of a contactor assembly, inserting the component into the mold, and forming a dielectric sleeve in at least one of the one or more signal probe holes through an injection molding process. The component includes one or more signal probe holes.

20 Claims, 8 Drawing Sheets

COAXIAL PROBE

BACKGROUND

The present disclosure is directed to an apparatus and method for use in testing semiconductor devices. In semiconductor test systems for testing integrated circuits, a contactor provides an interface between a test signal source and the semiconductor device under test. Included in the contactor are signal probes and ground probes that couple a test signal from a test signal source to the integrated circuit under test. The physical arrangement and spacing of the signal probes and ground probes within the contactor is dictated by the layout of signal and ground contacts on the semiconductor device being tested. Often, the spacing between the signal and ground contacts is irregular resulting in impedance mismatches between the test signal source and the semiconductor device under test. Impedance mismatches can cause unintended signals to be delivered to the device under test. Even when signal and ground probes are uniformly spaced cross-talk between the probes results in unintended noise signals being superimposed on the test signals. The noise signals and impedance mismatches can corrupt the test signals and cause incorrect test results. Aspects of the disclosed embodiments address these and other disadvantages and concerns associated with semiconductor testing.

SUMMARY

Consistent with the disclosed embodiments, an apparatus comprises a signal probe and a dielectric sleeve surrounding the signal probe. In some embodiments, the dielectric sleeve comprises a liquid crystal polymer. In some embodiments, the dielectric sleeve includes two separated sleeves. In some embodiments, the signal probe is a radio-frequency signal probe.

Consistent with the disclosed embodiments, an apparatus comprises a contactor assembly having a signal probe hole and a dielectric sleeve located in the signal probe hole. In some embodiments, the apparatus further comprises a radio frequency signal probe inserted into the dielectric sleeve. The radio frequency signal probe has a device under test contact and a test circuit contact. In some embodiments, the radio frequency signal probe has a return loss of less than between about minus 10 dB and about minus 30 dB between about 50 gigahertz and about 60 gigahertz. In some embodiments, the radio frequency signal probe includes a plurality of radio frequency signal probes and each of the plurality of radio frequency signal probes exhibits a cross-talk value lower than about 35 dB below about 40 gigahertz and lower than about 25 dB between about 20 and 60 gigahertz. In some embodiments, the radio frequency signal probe has an insertion loss of less than about 1.0 dB between about zero and about 60 GHz. In some embodiments, the apparatus further comprises a test circuit coupled to the test circuit contact and a device under test coupled to the device under test contact.

Consistent with the disclosed embodiments, a method comprises forming a contactor having a signal probe hole, the signal probe hole including a dielectric sleeve located in the signal probe hole, and inserting a radio-frequency probe into the dielectric sleeve. In some embodiments, forming the contactor having the signal probe hole comprises forming the dielectric sleeve through a molding process. In some embodiments, forming the dielectric sleeve through a molding process comprises molding a liquid crystal polymer to form the dielectric sleeve. In some embodiments, the method further comprises machining the dielectric sleeve.

Consistent with the disclosed embodiments, a method comprises forming a contactor having a signal probe hole, forming a radio-frequency signal probe including a surrounding sleeve, and inserting the radio frequency signal probe into the signal probe hole. In some embodiments, forming the contactor having the signal probe hole includes forming a body of the contactor. In some embodiments, forming the contactor having the signal probe hole includes forming a retainer of the contactor.

Consistent with the disclosed embodiments, a method comprises mold to receive a component of a contactor assembly, the component including one or more signal probe holes, inserting the component into the mold, and forming a dielectric sleeve in at least one of the one or more signal probe holes through an injection molding process. In some embodiments, forming the mold to receive the component of the contactor assembly comprises forming a mold including a reservoir to provide molding material to the component including the one or more signal probe holes. In some embodiments, the method further comprises machining the dielectric sleeve to provide a particular impedance for a radio-frequency signal probe inserted into the sleeve.

DESCRIPTION

Reference will now be made in detail to the embodiments implemented according to this disclosure, the examples of which are illustrated in the accompanying drawings.

Figure 1:
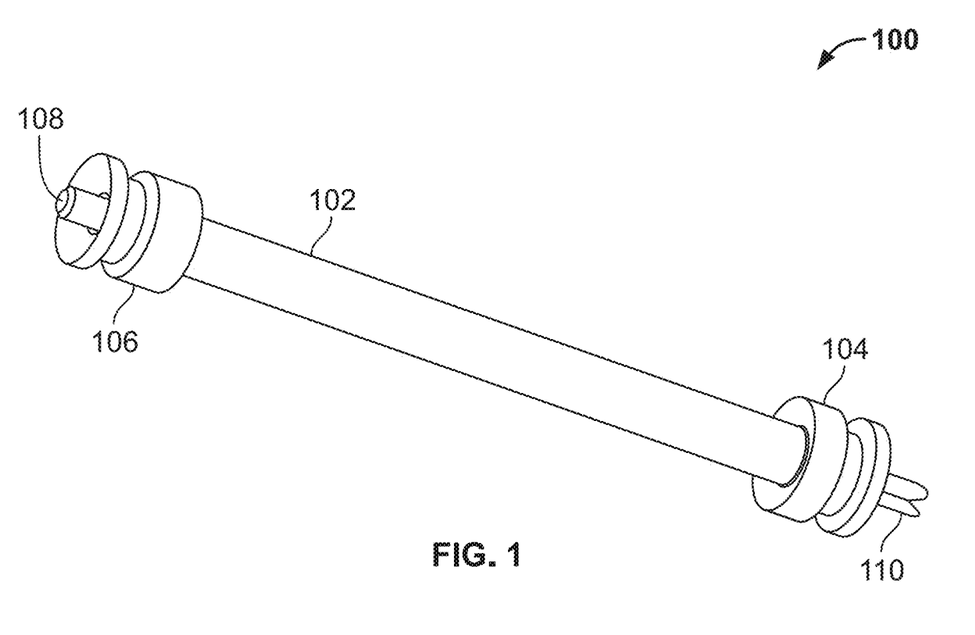
FIG. 1 shows an illustration of an apparatus including a signal probe and a dielectric sleeve surrounding the signal probe in accordance with some embodiments of the present disclosure.

FIG. 1 shows an illustration of an apparatus 100 including a signal probe 102 and a dielectric sleeve 104 surrounding the signal probe 102 in accordance with some embodiments of the present disclosure. In some embodiments, the dielectric sleeve 104 has the shape of a hollow cylinder and the apparatus 100 is assembled by sliding the signal probe 102 into the dielectric sleeve 104. The signal probe 102 provides a test signal path between a test system and a device under test, such as a digital or analog integrated circuit. The signal probe 102 is not limited to being formed from a particular material. Copper and copper alloys are materials suitable for use in the fabrication of the signal probe 102.

The dielectric sleeve 104, when added to the signal probe 102, changes the impedance of the signal probe 102. The dielectric sleeve 104 can be tailored, for example, by machining, to provide the signal probe 102 with a desired impedance. The dielectric sleeve 104 is not limited to being formed from a particular material. In some embodiments, the dielectric sleeve 104 includes a liquid crystal polymer. In some embodiments, the apparatus 100 includes more than one sleeve. For example, in some embodiments, the apparatus 100 includes the dielectric sleeve 104 and a second dielectric sleeve 106 separated along the length of the signal probe from the dielectric sleeve 104. The apparatus 100 is also not limited to all sleeves being formed from the same material. In some embodiments, the dielectric sleeve 104 is formed from a first dielectric material having a first dielectric constant and the second dielectric sleeve 106 is formed from a second dielectric material having a second dielectric constant, where the first dielectric constant is different from the second dielectric constant. Further, the apparatus 100 is not limited to a configuration in which the dielectric sleeve 104 is separated from the second sleeve 106. In some embodiments the dielectric sleeve 104 and the second dielectric sleeve 106 are touching. The apparatus 100 can be designed to operate at a wide range of frequencies and is not limited to transmitting signals limited to a particular frequency range. In some embodiments, the signal probe 102 is a radio-frequency signal probe and delivers radio-frequency signals from the test system to the device under test. Radio-frequency signals include frequencies up to 300 GHz.

Figure 2A:
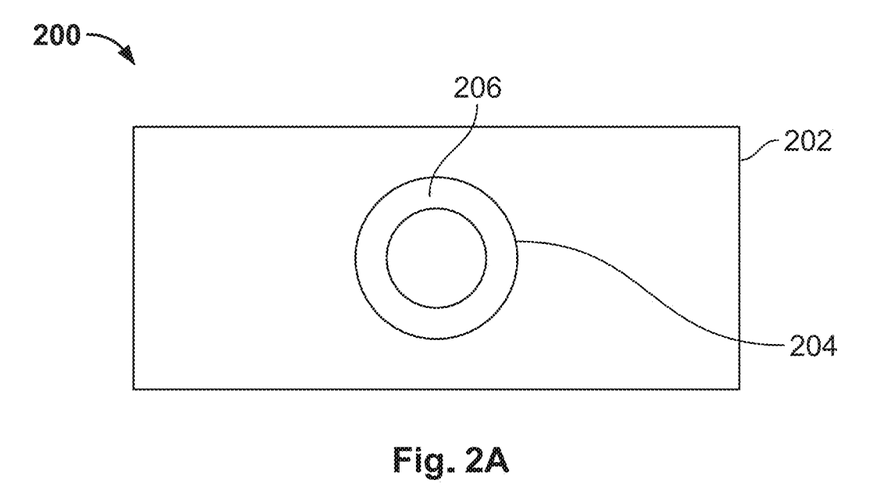
FIG. 2A shows a top view illustration of an apparatus including a contactor assembly having a signal probe hole, and a dielectric sleeve located in the signal probe hole in accordance with some embodiments of the present disclosure.
Figure 2B:
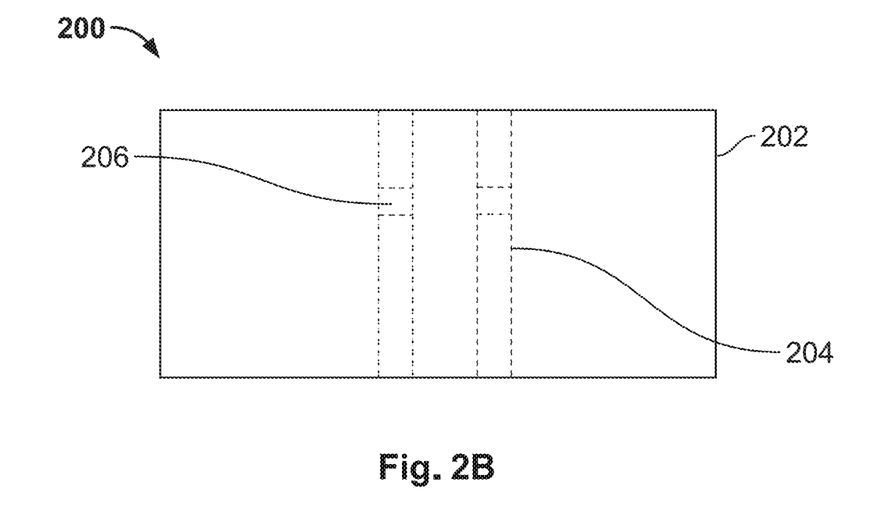
FIG. 2B shows a side view illustration of the apparatus shown in FIG. 2A including the contactor assembly, the signal probe hole and the dielectric sleeve located in the signal probe hole in accordance with some embodiments of the present disclosure.

FIG. 2A shows a top view illustration of an apparatus 200 including a contactor assembly 202 having a signal probe hole 204 and a dielectric sleeve 206 located in the signal probe hole 204 in accordance with some embodiments of the present disclosure. FIG. 2B shows a side view illustration of the apparatus 200 shown in FIG. 2A including the contactor assembly 202, the signal probe hole 204 and the dielectric sleeve 206 located in the signal probe hole 204 in accordance with some embodiments of the present disclosure. The contactor assembly 202 provides a housing for the signal probe 102 (shown in FIG. 1). In some embodiments the contactor assembly 202 includes a plurality of components. The dielectric sleeve 206 can be located in any of the components included in the fabrication of the contactor assembly 202. As shown, the dielectric sleeve 206 is located in the signal probe hole 204. In some embodiments, the dielectric sleeve 206 is formed through injection molding of a dielectric material into the signal probe hole 204 of the apparatus 200. Also, as shown, the dielectric sleeve 206, in this embodiment, has a length less that the length of the signal probe hole 204. The dielectric sleeve 206 can be machined or otherwise shaped to provide a desired impedance for the signal probe 102. As shown in the embodiment illustrated in FIG. 2A and FIG. 2B, the dielectric sleeve 206 is a hollow cylinder located in the signal probe hole 204. The signal probe hole 204 receives the signal probe 102 which delivers a test signal from a test system to a device under test.

In some embodiments, the apparatus 200 further includes the signal probe 102 (shown in FIG. 1) inserted into the signal probe hole 204 and the dielectric sleeve 206. In some embodiments, the signal probe 102 is a radio frequency signal probe that delivers radio frequency test signals to a device under test. Referring to FIG. 1, the signal probe 102 has a device under test contact 108 and a test circuit contact 110. In operation, the device under test contact 108 is electrically coupled to a signal port of the circuit being tested. The test circuit contact 110 is electrically coupled to the test system that provides test signals to the device under test. An unexpected advantage of this embodiment is that the signal probe 102 does not require a ground probe to be located nearby.

Figure 3:
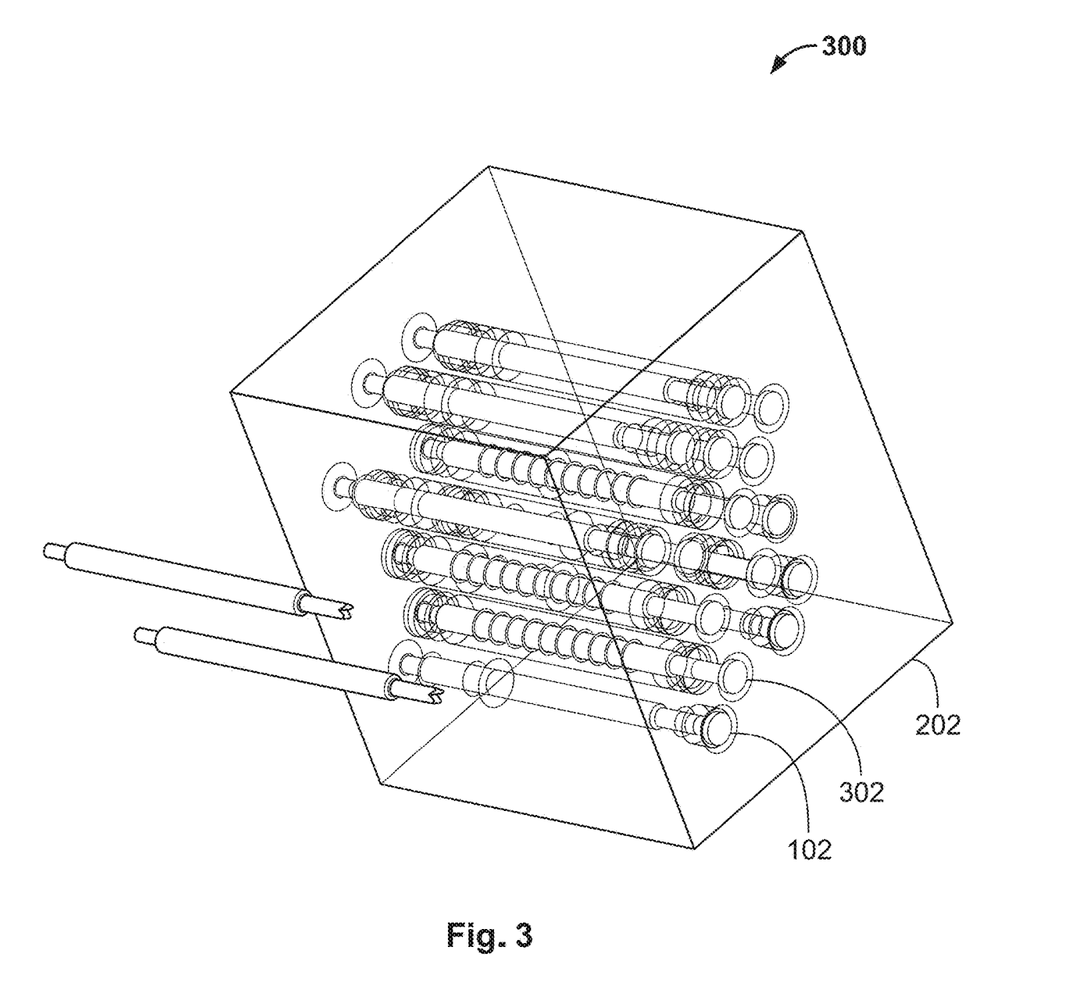
FIG. 3 shows an illustration of an apparatus showing signal probes and ground probes included in a contactor assembly in accordance with some embodiments of the present disclosure.

FIG. 3 shows an illustration of an apparatus 300 showing signal probes 102 and ground probes 302 included in a contactor assembly 202 in accordance with some embodiments of the present disclosure. The signal probes 102 and ground probes 302 can be arranged to mate with devices under test having different patterns and arrangements of signal probe and ground probe contacts. In some embodiments, the contactor assembly 202 includes only signal probes 102. In those embodiments, the grounding function is provided by the contactor assembly 202. The radio frequency impedance is maintained through coupling between the signal probes 102 (shown in FIG. 1) and surrounding metal shielding included in the contactor assembly 202. The interference noise between probes is also mitigated. The apparatus 300 transmits signals having frequencies in the radio-frequency range up to 300 GHz.

Figure 4:
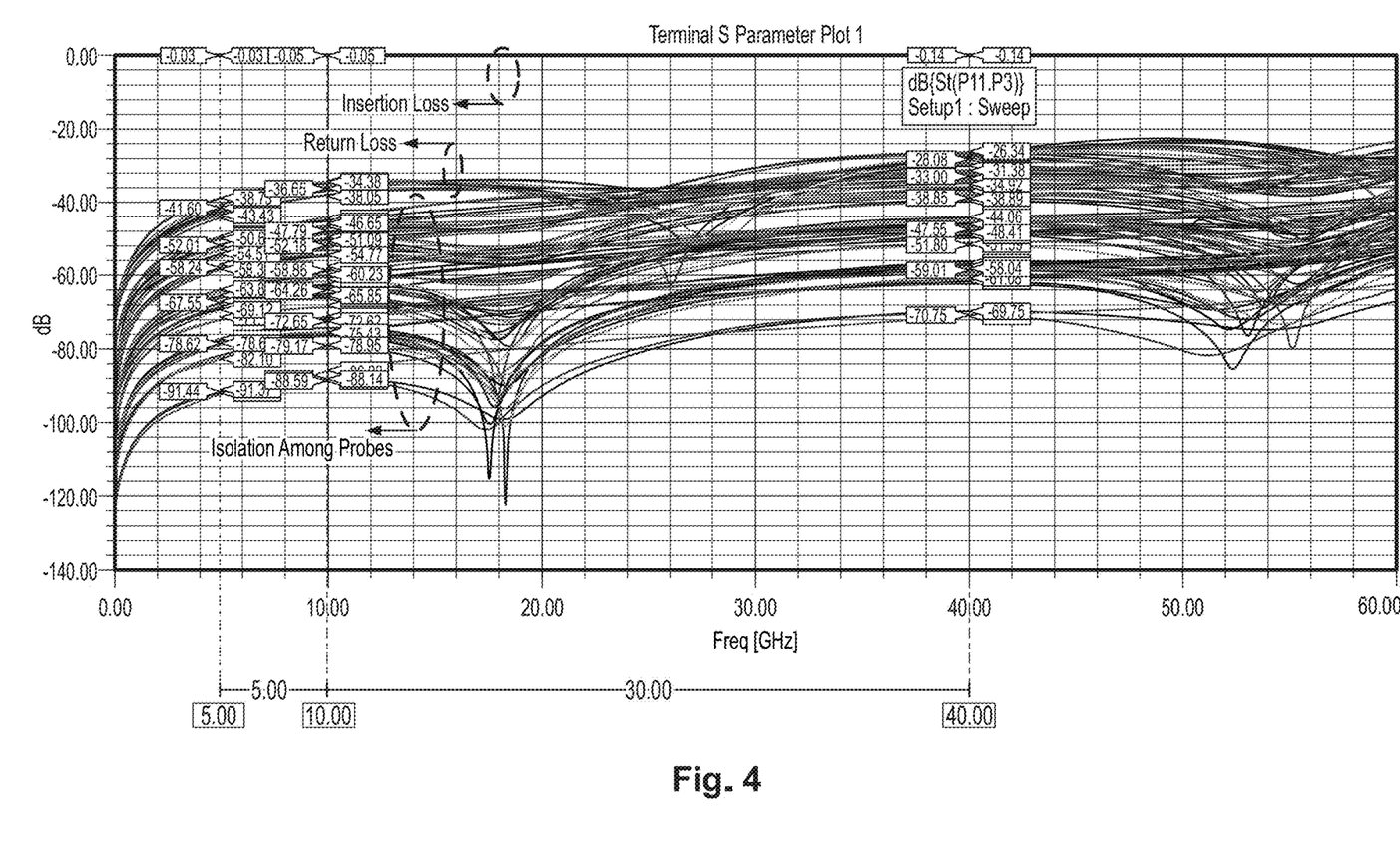
FIG. 4 shows a graph of return loss, cross-talk, and insertion loss versus frequency for a simulation of the performance of the signal probes illustrated in FIG. 3 in accordance with some embodiments of the present disclosure.

FIG. 4 shows a graph of return loss, cross-talk, and insertion loss versus frequency for a simulation of the performance of the signal probes 102 as illustrated in FIG. 3 in accordance with some embodiments of the present disclosure. As shown in the graph, the signal probe 102 including a dielectric sleeve 104 provides excellent impedance match (return loss lower than −20 dB until 60 GHz), very good isolation (cross talk lower than −35 dB until 40 GHz, lower than −25 dB until 60 GHz) and very low insertion loss of (less than 0.15 dB in 0-60 GHz band.) These results were unexpected. In some embodiments, the radio frequency signal probe 102 has a return loss of less than between about minus 10 dB and about minus 30 dB between about 50 gigahertz and about 60 gigahertz. In some embodiments, the radio frequency signal probe 102 includes a plurality of radio frequency signal probes and each of the plurality of radio frequency signal probes exhibits a cross-talk value lower than about 35 dB below about 40 gigahertz and lower than about 25 dB between about 20 and 60 gigahertz. In some embodiments, the radio frequency signal probe 102 has an insertion loss of less than about 1.0 dB between about zero and about 60 GHz.

Figure 5:
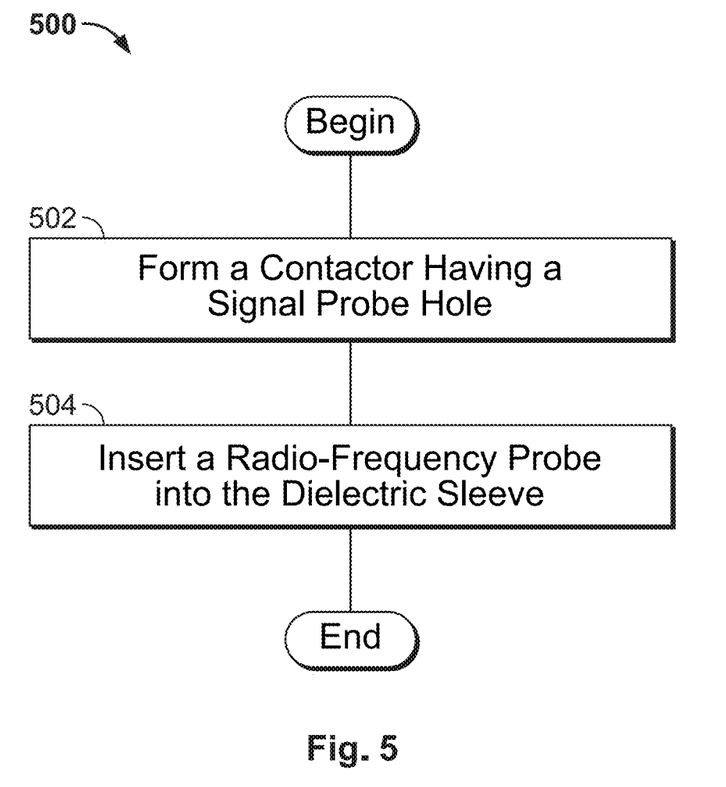
FIG. 5 shows flow diagram for a method of forming a contactor including a radio-frequency probe in accordance with some embodiments of the present disclosure.

FIG. 5 shows flow diagram 500 for a method of forming a contactor including a radio-frequency probe in accordance with some embodiments of the present disclosure. The method includes forming a contactor having a signal probe hole (block (502), and inserting a radio-frequency probe into the dielectric sleeve (block 504). The signal probe hole includes a dielectric sleeve located in the signal probe hole. In some embodiments, forming the contactor having the signal probe hole includes forming the dielectric sleeve through a molding process. In some embodiments, forming the dielectric sleeve through a molding process includes molding a liquid crystal polymer to form the dielectric sleeve. In some embodiments, the method further includes machining the dielectric sleeve. Machining of the dielectric sleeve 104 (shown in FIG. 1) provides for tailoring the impedance of the signal probe 102 (shown in FIG. 1) when the signal probe 102 is inserted in the dielectric sleeve 104 (shown in FIG. 1).

Figure 6:
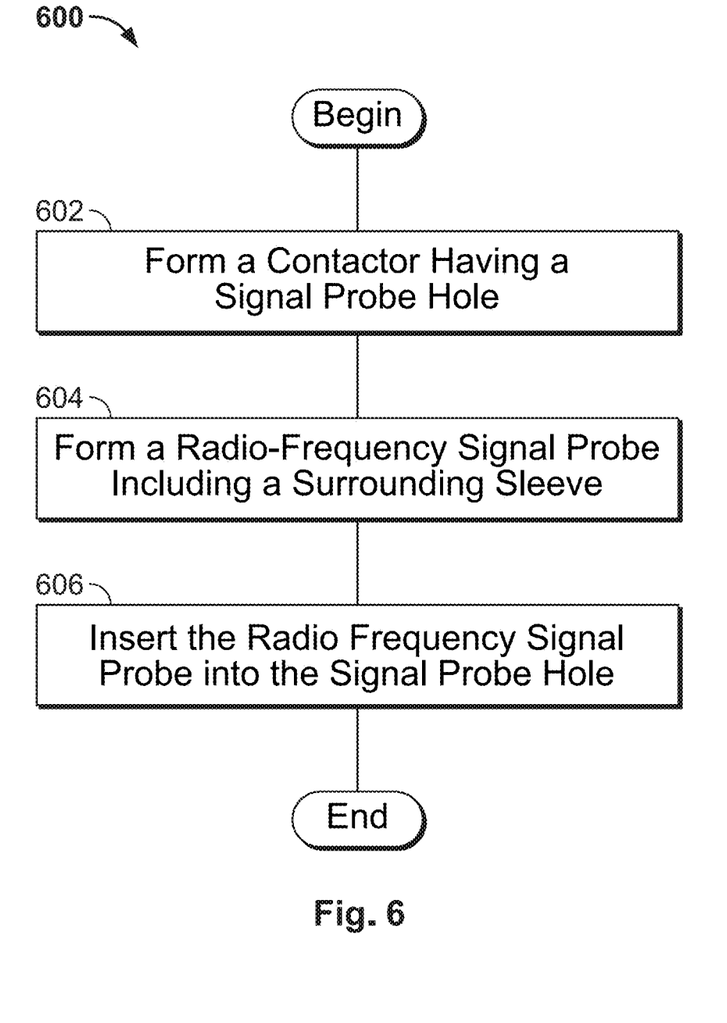
FIG. 6 shows a flow diagram for a method of forming a contactor including a radio-frequency probe in accordance with some embodiments of the present disclosure.

FIG. 6 shows a flow diagram 600 for a method of forming a contactor including a radio-frequency probe in accordance with some embodiments of the present disclosure. The method includes forming a contactor having a signal probe hole (block 602), forming a radio-frequency signal probe including a surrounding sleeve (block 604), and inserting the radio frequency signal probe into the signal probe hole (block 606). In some embodiments, forming the contactor having the signal probe hole includes forming a body of the contactor. In some embodiments, contactor having the signal probe hole includes forming a retainer of the contactor. A retainer is one component of a contactor assembly.

Figure 7:
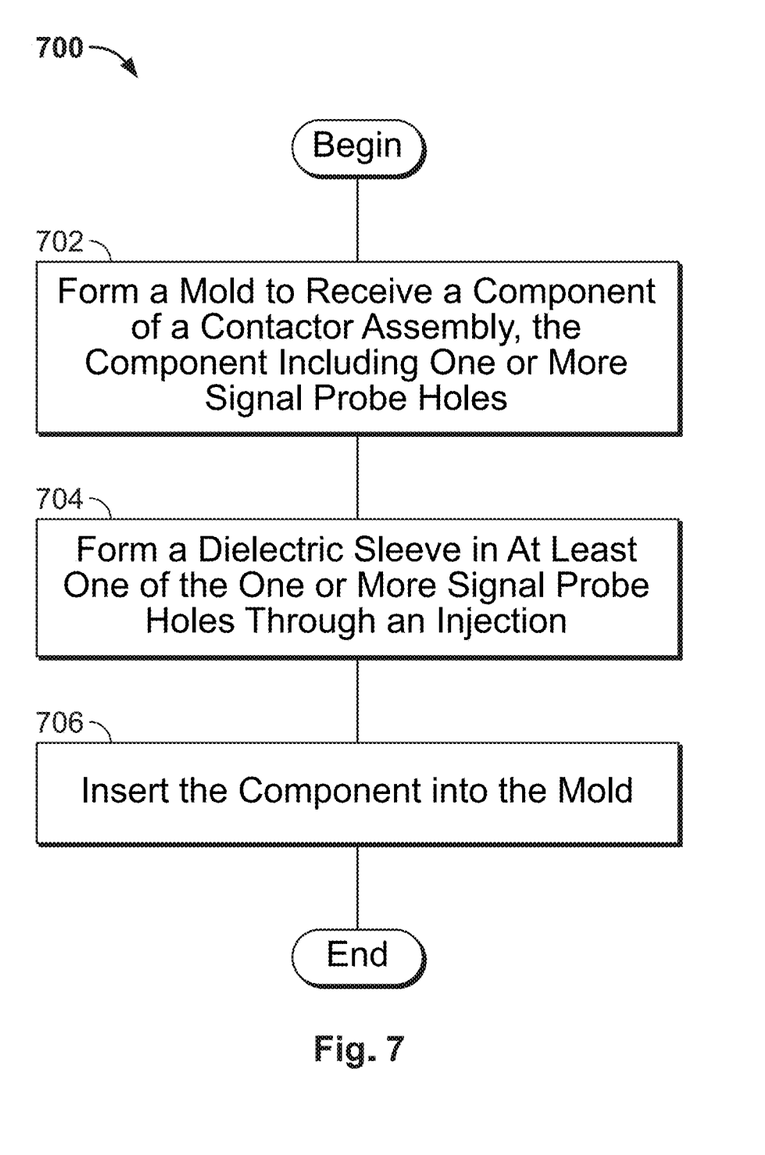
FIG. 7 shows a flow diagram for a method of making a component of a contactor assembly including a dielectric sleeve and a related mold in accordance with some embodiments of the present disclosure.

FIG. 7 shows a flow diagram 700 for a method of making a component of a contactor assembly including a dielectric sleeve and a related mold in accordance with some embodiments of the present disclosure. The method includes forming a mold to receive a component of a contactor assembly, the component including one or more signal probe holes (block 702), inserting the component into the mold (704), and forming a dielectric sleeve in at least one of the one or more signal probe holes through an injection molding process (706). In some embodiments, forming the mold to receive the component of the contactor assembly includes forming a mold including a reservoir to provide molding material to the component including the one or more signal probe holes. In some embodiments, the method further includes machining the dielectric sleeve to provide a particular impedance for a radio-frequency signal probe inserted into the sleeve.

Figure 8:
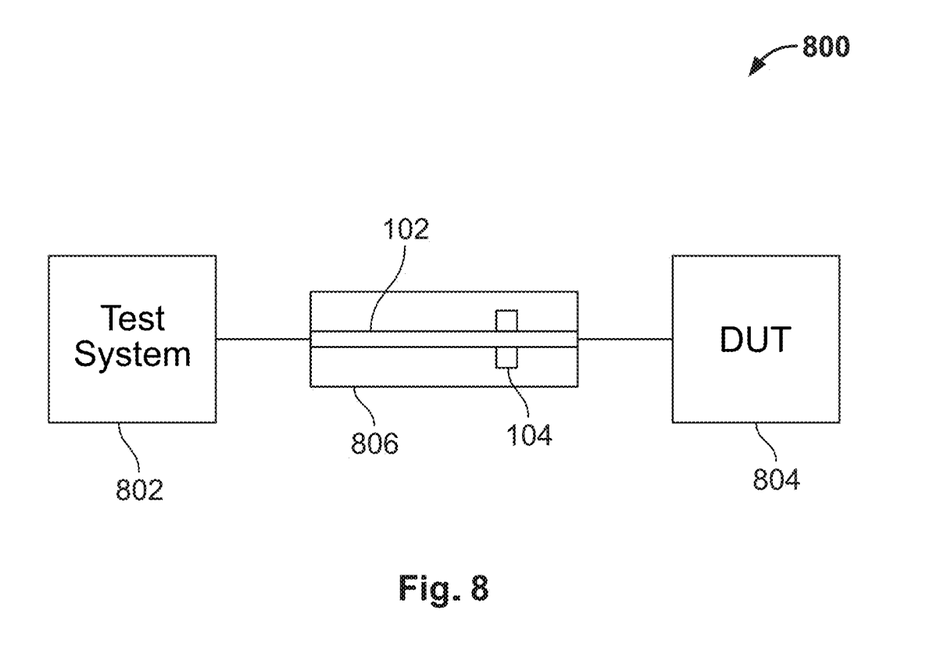
FIG. 8 shows a block diagram of an apparatus including a test system, a device under test, and a contactor assembly including a test probe having a dielectric sleeve in accordance with some embodiments of the present disclosure.

FIG. 8 shows a block diagram of an apparatus 800 including a test system 802, a device under test 804, and a contactor assembly 806 including a test probe 102 having a dielectric sleeve 104 in accordance with some embodiments of the present disclosure. In operation, the test system 802 generates test signals for testing the device under test 804. The dielectric probe 102 including the dielectric sleeve electrically couples the test signals from the test system 802 to the device under test 804. The device under test 804 is an electronic device, such as an analog, digital, or mixed signal integrated circuit. In some embodiments, the test signals are radio frequency signals.

In the preceding specification, various example embodiments have been described with reference to the accompanying drawings. It will, however, be evident that various modifications and changes can be made thereto, and additional embodiments may be implemented based on the principles of the present disclosure. The specification and drawings are accordingly to be regarded in an illustrative rather than restrictive sense.

For example, advantageous results still could be achieved if steps of the disclosed techniques were performed in a different order or if components in the disclosed systems were combined in a different manner or replaced or supplemented by other components. Other implementations are also within the scope of the following example claims.

What is claimed is:

1. An apparatus comprising:
a radio-frequency signal probe comprising a first contact structure configured to contact a device under test at a first side and a second contact structure configured to contact a test circuit at a second side opposite the first side; and
a plurality of dielectric sleeves surrounding the radio-frequency signal probe, wherein the dielectric sleeves are separated from each other along a length of the radio frequency signal probe, the length of the radio frequency signal probe extending between the first and second sides.

2. The apparatus of claim 1, wherein one or more of the dielectric sleeves comprise a liquid crystal polymer.

3. The apparatus of claim 2, wherein the dielectric sleeves include two separated sleeves disposed adjacent to the first contact structure and the second contact structure.

4. The apparatus of claim 1, wherein the radio-frequency signal probe extends through a contactor assembly having no ground probe disposed therein.

5. An apparatus comprising:
a contactor assembly having a signal probe hole;
a radio-frequency signal probe comprising a first contact structure configured to contact a device under test at a first side and a second contact structure configured to contact a test circuit at a second side opposite the first side; and
a dielectric sleeve located in the signal probe hole and surrounding the radio frequency signal probe,
wherein the contactor assembly has no ground probe disposed therein.

6. The apparatus of claim 5, wherein the radio-frequency signal probe is inserted through a plurality of dielectric sleeves, wherein the dielectric sleeves are separated from each other along a length of the radio frequency signal probe, the length of the radio frequency signal probe extending between the first and second sides.

7. The apparatus of claim 5, further comprising a test circuit coupled to the test circuit contact and a device under test coupled to the device under test contact.

8. An apparatus comprising:
a contactor assembly having a signal probe hole;
a dielectric sleeve located in the signal probe hole; and
a radio frequency signal probe inserted into the dielectric sleeve, the radio frequency signal probe having a device under test contact and a test circuit contact, wherein the radio frequency signal probe has a return loss of less than between about minus 10 dB and about minus 30 dB between about 50 gigahertz and about 60 gigahertz.

9. An apparatus comprising:
a contactor assembly having a signal probe hole;
a dielectric sleeve located in the signal probe hole; and
a radio frequency signal probe inserted into the dielectric sleeve, the radio frequency signal probe having a device under test contact and a test circuit contact, wherein the radio frequency signal probe includes a plurality of radio frequency signal probes and each of the plurality of radio frequency signal probes exhibits a cross-talk value lower than about 35 dB below about 40 gigahertz and lower than about 25 dB between about 20 and 60 gigahertz.

10. An apparatus comprising:
a contactor assembly having a signal probe hole;
a dielectric sleeve located in the signal probe hole; and
a radio frequency signal probe inserted into the dielectric sleeve, the radio frequency signal probe having a device under test contact and a test circuit contact, wherein the radio frequency signal probe has an insertion loss of less than about 1.0 dB between about zero and about 60 GHz.

11. A method comprising:
forming a contactor having a signal probe hole, the signal probe hole including a plurality of dielectric sleeves located in the signal probe hole;
inserting a radio-frequency probe into the dielectric sleeves such that the dielectric sleeves are separated from each other along a length of the radio frequency signal probe; and
forming a first contact structure configured to contact a device under test at a first side of the radio-frequency signal probe and a second contact structure configured to contact a test circuit at a second side of the radio-frequency signal probe opposite the first side, the length of the radio frequency signal probe extending between the first and second sides.

12. The method of claim 11, wherein forming the contactor having the signal probe hole comprises forming the dielectric sleeves through a molding process.

13. The method of claim 12, wherein forming the dielectric sleeves through a molding process comprises molding a liquid crystal polymer to form the dielectric sleeves.

14. The method of claim 13, further comprising machining the dielectric sleeves.

15. A method comprising:
forming a contactor having a signal probe hole;
forming a radio-frequency signal probe including a plurality of surrounding dielectric sleeves, wherein the dielectric sleeves are separated from each other along a length of the radio frequency signal probe;
inserting the radio frequency signal probe into the signal probe hole; and
forming a first contact structure configured to contact a device under test at a first side of the radio-frequency signal probe and a second contact structure configured to contact a test circuit at a second side of the radio-frequency signal probe opposite the first side, the length of the radio frequency signal probe extending between the first and second sides.

16. The method of claim 15, wherein forming the contactor having the signal probe hole includes forming a body of the contactor.

17. The method of claim 16, wherein forming the contactor having the signal probe hole includes forming a retainer of the contactor.

18. A method comprising:
forming a mold to receive a component of a contactor assembly, the component including one or more signal probe holes;
inserting the component into the mold; and
forming a dielectric sleeve in at least one of the one or more signal probe holes through an injection molding process.

19. The method of claim 18, wherein forming the mold to receive the component of the contactor assembly comprises forming a mold including a reservoir to provide molding material to the component including the one or more signal probe holes.

20. The method of claim 18 further comprising machining the dielectric sleeve to provide a particular impedance for a radio-frequency signal probe inserted into the sleeve.

* * * * *